United States Patent [19]

Uchida

[11] Patent Number: 5,687,267
[45] Date of Patent: Nov. 11, 1997

[54] INTEGRATED OPTOELECTRONIC COUPLING AND CONNECTOR

[75] Inventor: Toshi K. Uchida, San Pedro, Calif.

[73] Assignee: Optobahn Corporation, Torrance, Calif.

[21] Appl. No.: 676,736

[22] Filed: Jul. 8, 1996

Related U.S. Application Data

[63] Continuation of Ser. No. 313,765, Sep. 28, 1994, Pat. No. 5,535,296.

[51] Int. Cl.⁶ ........................................... G02B 6/42
[52] U.S. Cl. ........................... 385/89; 385/94; 385/137
[58] Field of Search ........................... 385/8, 14, 15, 385/88–94, 125, 137

[56] References Cited

U.S. PATENT DOCUMENTS 5,168,537 12/1992 Rayasekharam et al. ............ 385/94 X Primary Examiner—Phan T. H. Palmer
Attorney, Agent, or Firm—Beehler & Pavitt

[57] ABSTRACT

An optoelectronic module has an optoelectronic receiver or transmitter supported in optical alignment with optical fibers on a common substrate assembly. The module is optically prealigned and can be mounted through a hole in an enclosure containing transmitter or receiver circuits to make a complete optoelectronic package. The module may be hermetically and electromagnetically sealed to the enclosure. In one form of the invention, the optical fibers terminate at a rear face of the module, and the module can be coupled to a conventional fiber optic connector.

37 Claims, 5 Drawing Sheets

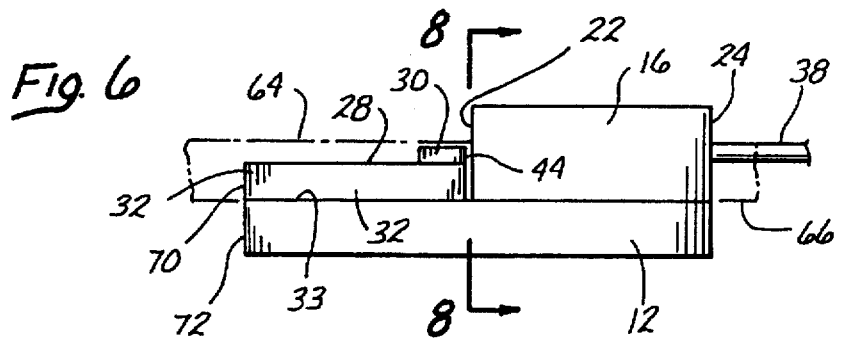
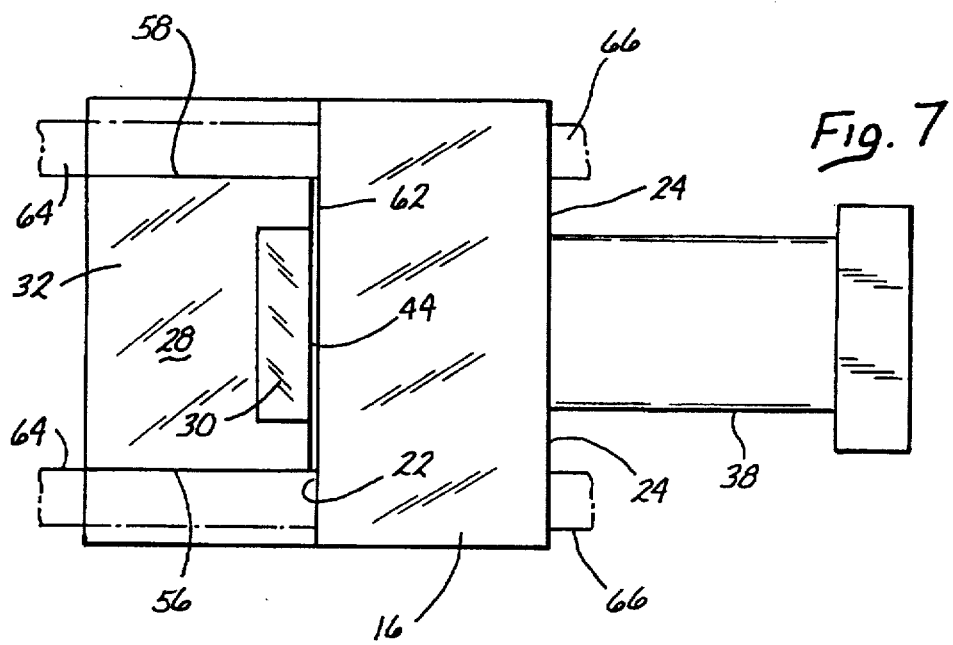
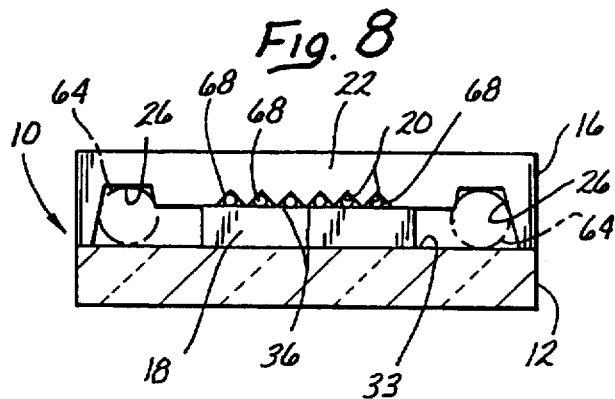
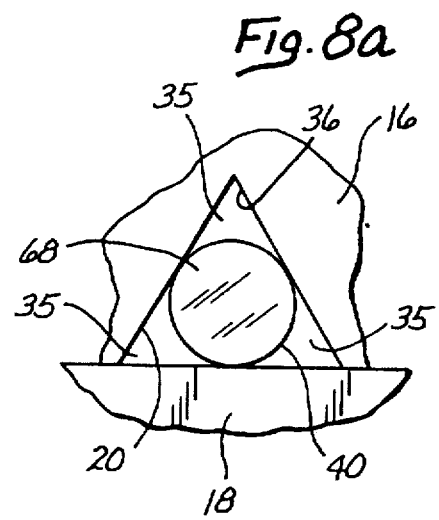

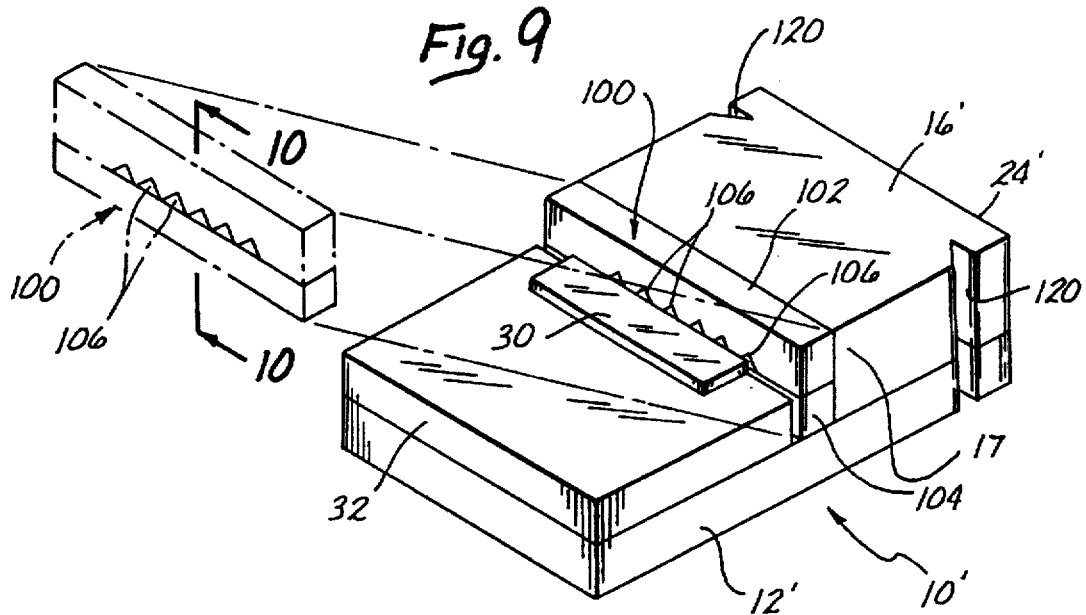
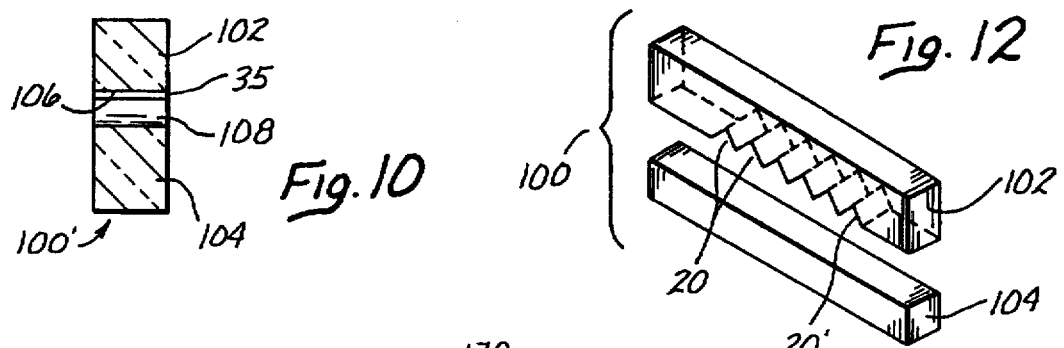
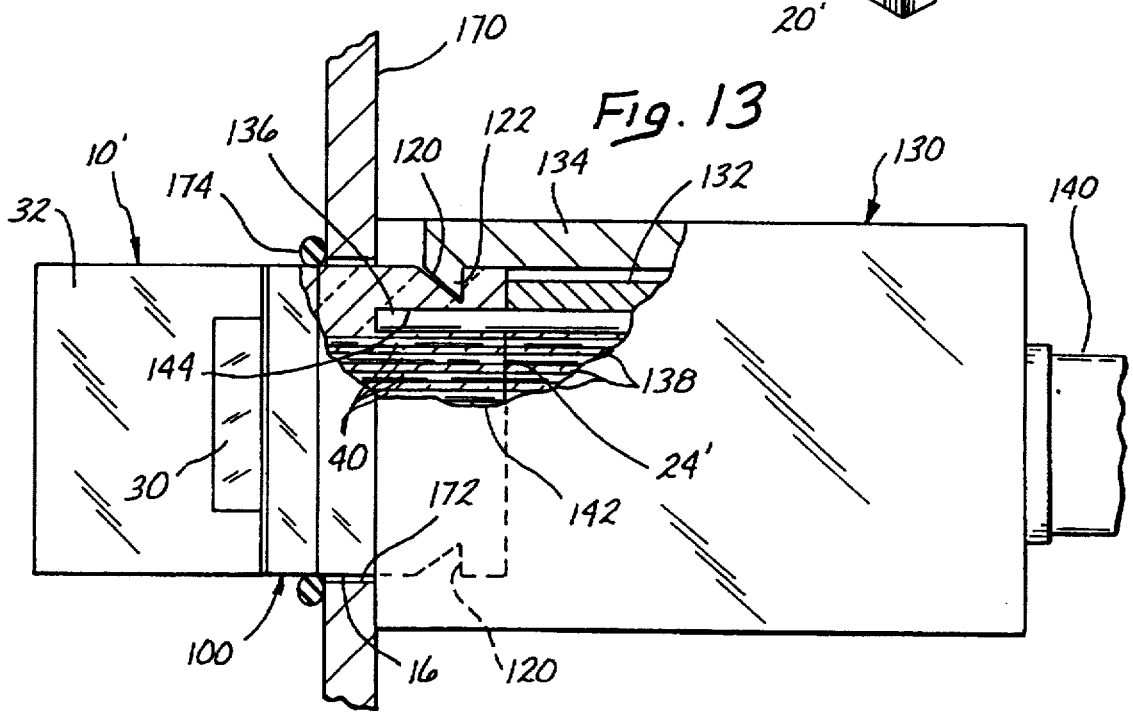

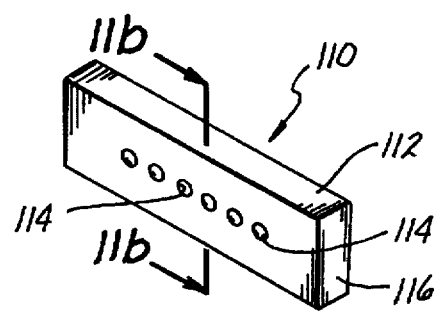
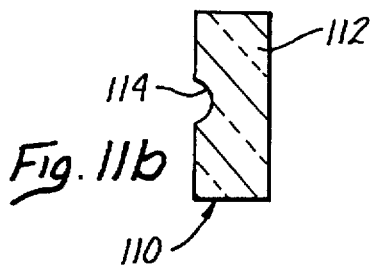
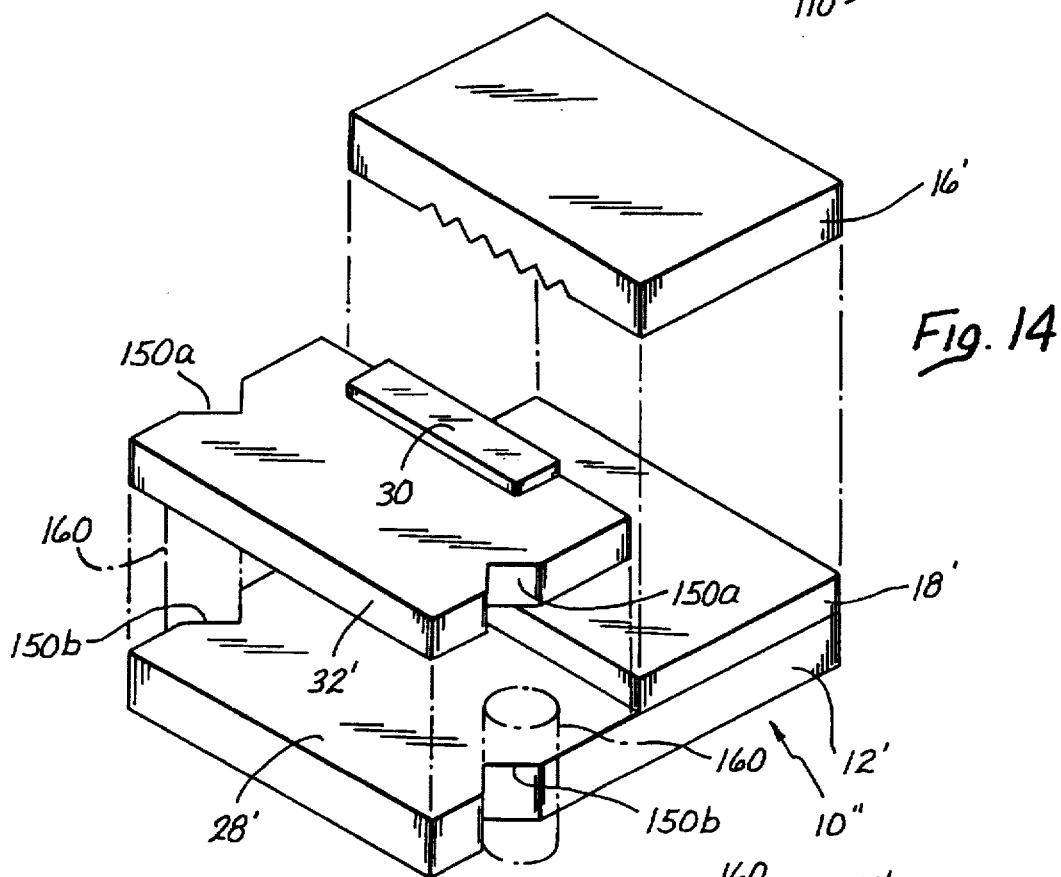
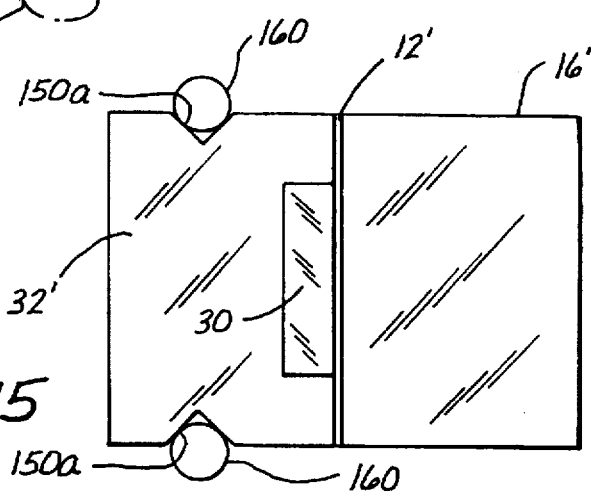

5,687,267

INTEGRATED OPTOELECTRONIC COUPLING AND CONNECTOR

This application is a continuation of application Ser. No. 08/313,765, filed Sep. 28, 1994 now U.S. Pat. No. 5,535,296.

BACKGROUND OF THE INVENTION

1. Field of the Invention

This invention relates generally to the field of optoelectronics and more specifically is directed to an integrated assembly for coupling laser diodes or photodetectors to optical fibers.

2. State of the Prior Art

Optical interconnection of electronic data and communication systems is of great interest as it offers use of small, relatively lightweight cable, large transmission capacity, long transmission distance, and immunity to electromagnetic noise, compared with electrical cables using metallic conductors. Potential applications include, but are by no means limited to, telephone transmission lines, subscriber television cable service, and interconnection of subsystems in large computer architectures at different packaging hierarchies, such as chip-to-chip, board-to-board, card-cage to card-cage, and inter-cabinet connections.

Optical fibers are continuous lengths of finely drawn, highly transparent glass material which can transmit light over long distances. Optical fibers must be interfaced to the electronic circuits which generate and process the electrical signals carried by the fibers. At the transmitter end, the electronic circuits drive light emitting semiconductors, such as laser diodes, which produce light pulses fed into the optical fibers. At the receiving end, the light signals carried by the optical fibers are directed onto photodetectors which convert the optical, i.e. light signals to an electrical signal for further processing by electronic receiver circuitry.

Typically, optical fiber transmission lines are made up of bundles of such fibers for carrying parallel data. Data is fed to each optical fiber by a corresponding light emitting element which is electrically modulated such that the light output corresponds to an electrical signal input. The light emitting elements are typically formed on a single semiconductor chip, such as a laser diode array, which may for example have twelve mutually independent laser diode emitters spaced along a line on a common face of the chip. The individual laser diodes of the array are closely spaced to each other and each emits a cone of light. The cones spread out and begin to overlap at a short distance from the laser chip. In order to avoid cross-over and interference between the optical signals, the laser diode emitters must be positioned closely to the end faces of the optical fibers comprising the optical transmission link. The close spacing between the laser diode emitters, coupled with the small diameter of the fiber end faces and even smaller core diameters, requires precise alignment of the diode array in relation to the optical fiber holder, so that a maximum amount of laser light illuminates the corresponding optical fiber core. Misalignment between the laser diode and the fiber core results in wasted laser output and a consequent weakening of the transmitted light signal. Proper alignment of the laser diode array is specially important when single mode optical fibers are employed, due to the very small diameter of the core of such fibers. Multi-mode optical fiber cores are substantially larger in diameter, and alignment of the laser diode array is easier in such case.

For the potential of optoelectronic communication to be fully realized improvement is needed in the packaging of the optoelectronic components, particularly the assemblies used for creating the interface between the electrical and optical portions of the system. In particular, improvement is needed in regard to the mounting of the light emitting and photo detector devices and their coupling to the optical fibers in order to improve the efficiency and reliability of the optoelectronic interconnects, and to reduce the cost of current assemblies which rely on discrete, precision machined components, require costly, labor intensive active alignment, and offer inadequate thermal and mechanical stability.

One type of widely used optical fiber connector, the MT (Mechanically Transferable) type connectors, has an optical fiber holder where the fibers are captive in channels defined between an upper substrate and a lower substrate. Typically, one substrate has a surface traversed by parallel grooves, each groove having a V-shaped cross-section. A flat surface of the other substrate is joined against the grooved surface to define between the two substrates parallel channels of triangular cross-section. A fiber ribbon or cable containing one or more optical fibers is clamped between the two substrates and individual fibers extend from the cable or ribbon within corresponding channels and terminate at a common plane surface defined by the two substrates, the fiber ends being arranged along a straight line formed by the junction of the two substrates. Each optical fiber has a light transmitting core surrounded by a cladding. The diameter of the fiber is normally 125 microns including the cladding. The core diameter is 62.5 microns for multi-mode fibers, and only 10 microns for single mode fibers. The interior dimensions of the triangular channels are held to very close tolerances so that in cross section the cylindrical fibers make tangential contact with the center of each side surface of the channel. The fiber ends as well as the common plane surface of the substrates are highly polished and flat to facilitate close physical contact with a second similar holder for making an optical connection between two lengths of fiberoptic cable. Alignment of the fiber ends between the two connectors is ensured by precisely machined guide pins on one connector mated to equally precise guide holes in the other connector. This type of optical fiber connector is available from NGK of Japan with the two substrates made of ceramic material, and in a precision plastic version from US Conec Ltd., of Hickory, N.C.

Current engineering practice is to mount the light emitting and photo detector elements separately from the optical fiber holder or connector, on a submount which is part of the optoelectronic package containing the transmitter/receiver electronics. The fiber optic connector is mechanically engaged to the housing of the optoelectronic package and is held in alignment with the photo emitter or detector by alignment pins or other mechanical expedient. Such assemblies typically require active alignment, i.e., the laser diode is powered up and adjusted until the light output of the optical fibers is maximized. Prior art optoelectronic couplings and connectors which rely on a combination of structural materials having different coefficients of thermal expansion tend to suffer from thermal instabilities. As different parts of a coupling or connector expand at different rates with temperature changes, the optical alignment between the light emitting device and the optical fibers can be affected, diminishing the power delivered by the light emitting device to the optical fibers and in extreme cases disrupting the optoelectronic link.

What is needed is an optoelectronic coupling with thermally stable and mechanically dependable integrated mounting of the laser diode/photo detector and optical fiber holder on a common base. Past efforts in that direction have produced laboratory prototypes with technologies which have proven prohibitive and impractical for manufacture in commercial quantities. In one such prior effort, a number of parallel grooves were chemically etched in the surface of a silicon base, and optical fibers were laid in the grooves and secured in place with adhesive. The groove depth was Such that only the fiber cladding was recessed below the silicon surface and the fiber cores remained above surface. A laser diode array was mounted on the silicon base in alignment for illuminating the end surfaces of the optical fiber cores. Power was supplied to the laser diode through metal film electrodes deposited on the silicone base and connected by wire bonding to corresponding electrodes of the laser diode. This assembly, which performs reasonably well under laboratory conditions, is impractical for commercial applications. Firstly, the chemical etching technology needed to make the precisely dimensioned grooves is very difficult to control, and is an expensive process not suited to commercial production. Further, silicon has a rather large coefficient of thermal expansion, which tends to make the assembly thermally unstable, and lacks adequate mechanical strength for field use in connector applications.

A continuing need exists for a commercially practical and reasonably priced integrated optoelectronic coupler and connector offering good thermal stability, satisfactory mechanical strength and advantageous electrical properties.

SUMMARY OF THE INVENTION

The invention disclosed below addresses the aforementioned need by providing an optoelectronic coupler featuring integrated, optically coupled mounting of a laser diode/photodetector and optical fibers. The integrated mounting has a base, an optical fiber holder on the base, a number of parallel channels defined through the holder, optical fibers in the channels terminating in fiber ends on one of the opposite sides, and a laser diode or photodetector unit fixed to an upper surface of the submount and positioned in optically coupled relationship with the fiber ends, characterized in that the optical fiber holder and the laser diode or photodetector are both mounted on a common unitary base, and the base and fiber holder are constructed of the same material. The presently preferred material is a ceramic, such as alumina. Other materials are also suitable, however, such as dimensionally and thermally stable engineering plastics.

The parallel channels of the fiber holder are defined in a plane parallel to and spaced above the upper surface of the base. The laser diode or photodetector may be directly mounted on the base, or may be mounted on a top surface of a submount which is itself mounted to the upper surface of the base. The submount may be a rectangular block permanently affixed to the upper surface of the base, for example by means of a metallized undersurface soldered to a metallized upper surface of said base.

The laser diode or photodetector may consist of multiple devices packaged as an array, in which case the array package may have one common electrode of one polarity and a number of discrete electrodes of opposite polarity. Supply electrode pads can be provided on the substrate by selective metallization of the substrate surface. The array package may be fixed to the submount by soldering the common electrode to a corresponding supply electrode pad on the submount and connecting the discrete electrodes by wire bonding to discrete supply electrode pads on the submount. Alternatively, the discrete electrodes of the array package may be soldered to corresponding electrode pads on the submount, and the common electrode wire bonded to a corresponding supply electrode pad on the submount. In the latter case, bump pad soldering may be used where the surface tension of molten solder between the laser diode and the electrode pads on the submount brings the diode into a prealigned position, such that upon proper assembly of the submount to the base, the laser diode will be correctly aligned with the cores of the optical fibers in the holder. Alternatively, the laser diode can be positioned on the substrate in relation to reference pre-set reference markings. Either of these laser array mounting and positioning methods may be employed where the submount is integral with the base and the array is mounted directly to the base. Whether the submount is a separate element or is integral with the base, it serves to raise the array to a position where the array is in a common plane with the ends of the optical fibers. The laser diode array mounted to a separate submount can be assembled to the coupler and aligned with the optical fibers with the aid of guide pins positioned by means of pin guides accurately defined in the coupler. A pair of parallel guide pins inserted in the pin guides can be accurately positioned relative to the base and used as a reference for positioning the submount on the base with the laser diode mounted on the submount in optical alignment with the optical fiber ends. The guide pins are removed once the submount and laser diode are assembled to the base. The pin guides may also serve to receive the pins of a male connector in one configuration of the coupler unit.

Still another improvement according to this invention is an optical scrambler unit also integrated with the integrated mounting assembly and interposed between the laser diode and the fiber ends. The scrambler unit is desirably made of the same material as the fiber holder and the base for thermal and mechanical compatibility. The scrambler unit can be constructed analogously to the optical fiber holder, by joining a V-grooved upper substrate to a plane surface of a lower substrate. Alternatively, the scrambler may be a single block of transparent material with integrally formed lens elements. A transparent ceramic may be used for this purpose, and the same ceramic also used for making the optical fiber holder, base and submount components of the integrated holder.

The integrated mounting unit can be connected to a fiber optic cable either by providing a suitable connector at the free end of the optical fibers extending from the holder in a pig tail configuration, or by also terminating the optical fibers at the rear surface of the holder, and providing male or female retainers configured to interlock with a connector of opposite gender at the end of the fiber optic cable, such that the connector normally attached to the tail is also integrated to the coupling unit which then combines the functions of an optoelectronic coupler and connector in one compact and rugged package. Airtight mechanical sealing and EMI shielding of an optoelectronic package are readily possible using such an integrated coupler by metallizing the coupler surfaces and sealing the fiber containing channels.

BRIEF DESCRIPTION OF THE DRAWINGS

FIG. 6 is a side elevational view of the integrated coupler of FIG. 1, with submount alignment pins shown in phantom lining;

FIG. 7 is a top plan view of the integrated coupler of FIG. 1 with substrate alignment pins shown in phantom lining and provided with a pig-tail optical fiber connection;

FIG. 8 is a section taken in elevation along line 8—8 in FIG. 6;

FIG. 8a is an enlarged detail view showing the end of an optical fiber contained in a triangular channel of the fiber holder.

FIG. 9 shows in perspective view an integrated coupler equipped with an optical scrambler unit employing V-groove technology and notched to make an integral female connector;

FIG. 10 is a section of the optical scrambler taken along line 10—10 in FIG. 9, showing the use of rod lenses in the scrambler;

FIG. 11a is a perspective view of an alternate optical scrambler unit with integral microlenses;

FIG. 11b is a section along line 11b—11b in FIG. 11a;

FIG. 12 is an exploded perspective view of the scrambler unit of FIG. 9;

FIG. 13 is a top plan view of the integrated coupler of FIG. 9 shown connected to a male MTB type optical connector;

FIG. 14 is an exploded view of an integrated optoelectronic coupler adapted for assembly with vertical alignment pins instead of the horizontal pins employed in FIGS. 6 through 8;

FIG. 15 is a top plan view of the coupler of FIG. 14 in assembled condition between the vertical alignment pins.

With reference to the drawings in which like numerals designate similar elements, FIG. 1 shows an integrated optoelectronic coupler 10 which has a rectangular base 12 and an optical fiber holder 14 which includes a V-groove substrate 16 and a fiber clamping substrate 18, the assembly of which is better understood by reference to FIGS. 2 and 8. The upper, grooved substrate 16 has a number of parallel grooves 20 which extend fully across the upper substrate 16 between a front side 22 and a rear side 24. The upper substrate 16 also defines two parallel pin guide slots 26 with the upper surface 28 of the base 12. A laser diode array 30 is fixed to the top surface 33 of a submount 32 which in turn is fixed to the upper surface 28 of the base 12.

Figure 1:
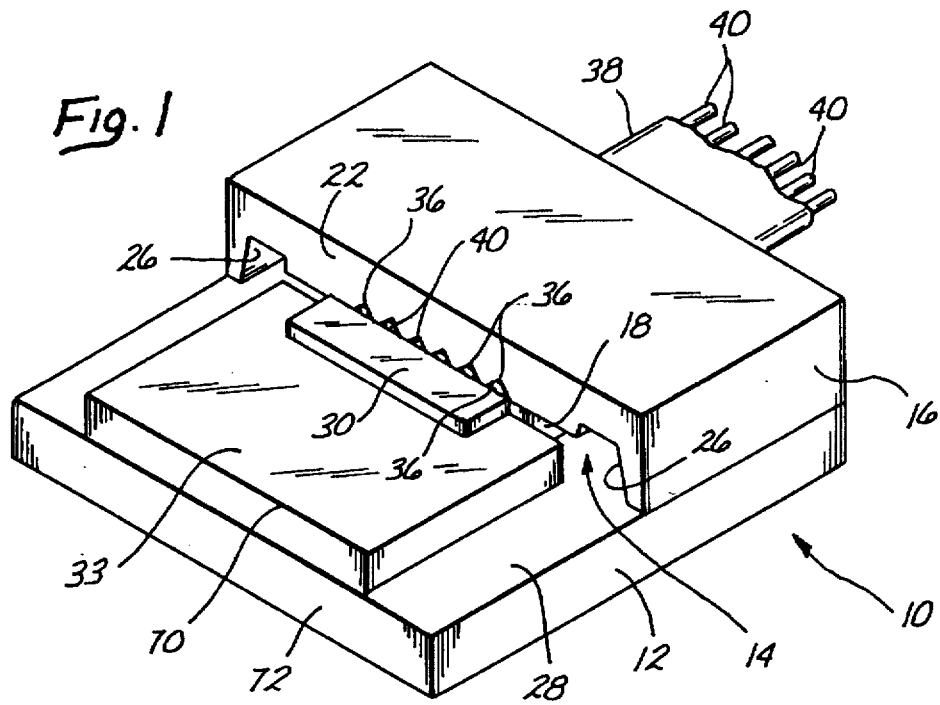
FIG. 1 is a perspective view of an integrated optoelectronic coupler according to this invention.

Each groove 20 has a V-shaped cross-section, with two side walls in the groove at a 60 degree angle to each other. When the upper substrate 16, is assembled to the base 12, the top surface 34 of the lower substrate 18 covers the grooves 20, which then form parallel channels 36 of triangular cross-section extending between the opposite sides 22, 24 of the upper substrate 16. Each channel has an equilateral triangular cross-section such that a cylindrical optical fiber 40 laid within each groove 20 touches the center of each side wall of the triangular channels, making line contact with each side wall along the length of the channel. Each fiber 40 is thus closely contained in a straight line between the upper substrate 16 and lower substrate 18 which together form an optical fiber holder assembly. The optical fibers 40 extend from a fiber ribbon 38 clamped between the holder substrates 16 and 18. Each fiber 40 terminates at a fiber end face 68 which is polished flat with the front surface 22 of the V-grooved substrate 16.

Figure 2:
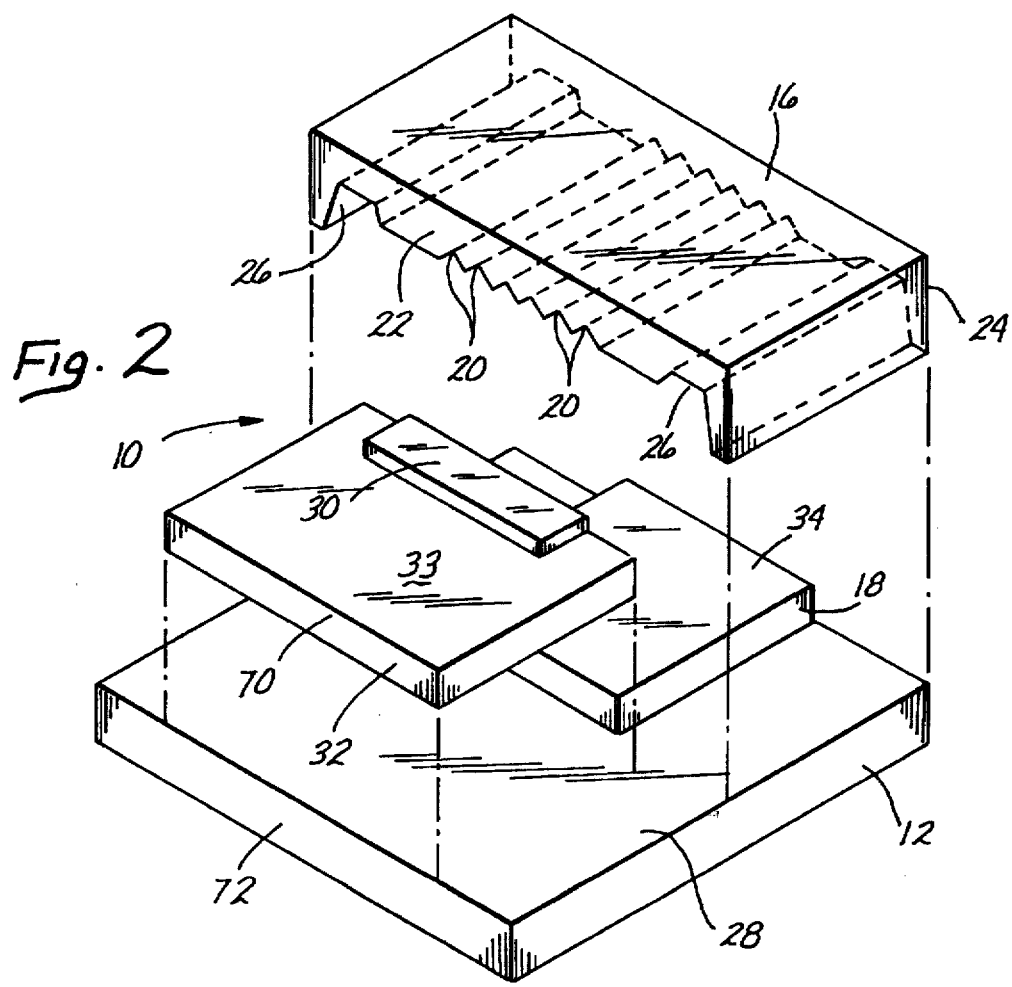
FIG. 2 is an exploded view of the coupler of FIG. 1.

The upper substrate 16 and lower substrate 18 are made to very close tolerances by precision machining, as exemplified by the high precision ceramic optical multi-fiber connectors sold by NGK of Japan, through their U.S. distributors NGK-Locke, Inc. of Santa Clara, Calif. The NGK ceramic components features V-grooved substrates for supporting optical fibers in multi-fiber connectors and related assemblies. The existing NGK ceramic holders for optical fibers have a lower substrate or base which is of equal width as the width of the upper substrate 16 between its opposite sides 22, 24. It is the improvement of the present invention to extend the base 12 beyond the front side 22 of the upper substrate 16, also support the submount 32 on a common base 12 with the V-grooved substrate 16, as shown in FIGS. 1 and 2.

Figure 3:
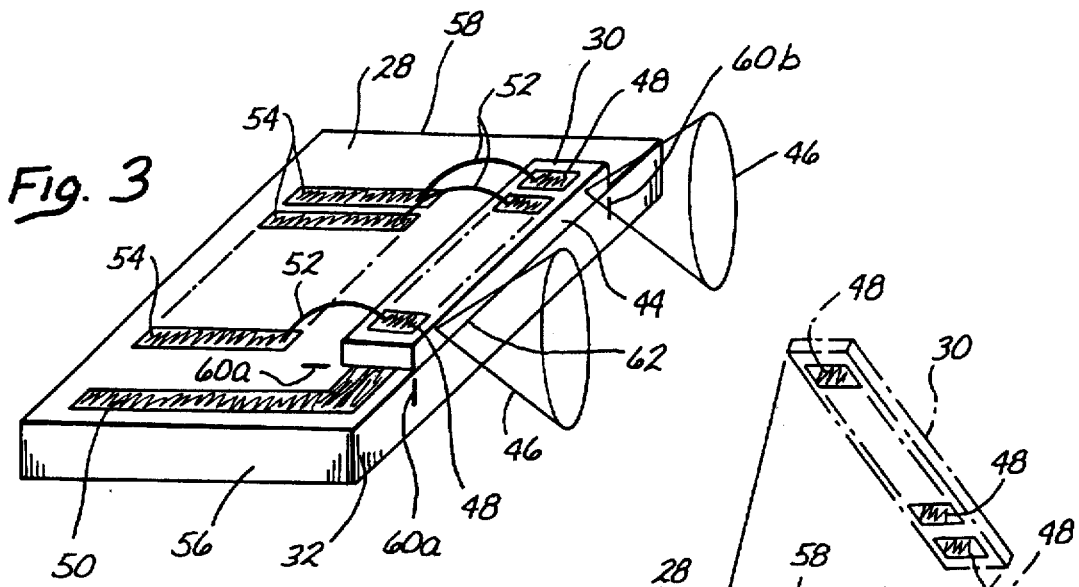
FIG. 3 is a perspective drawing of a laser diode array fixed on a submount for subsequent assembly to the integrated coupler as in FIG. 1.
Figure 4:
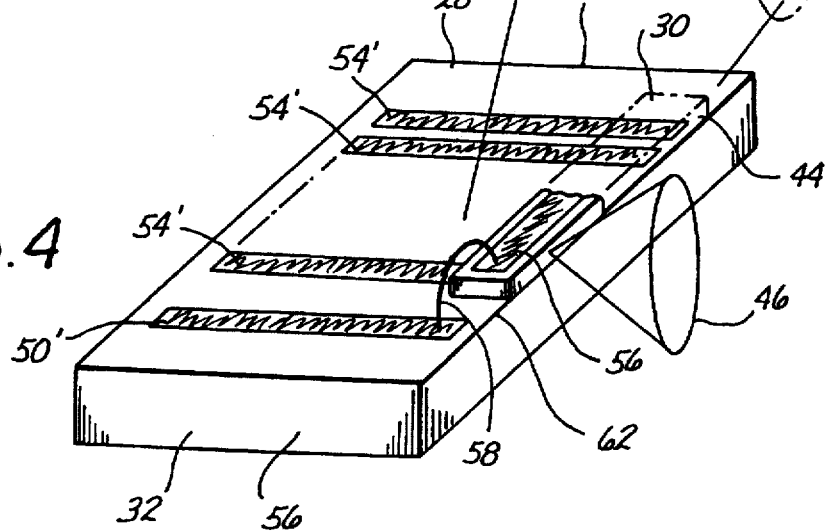
FIG. 4 is a view as in FIG. 3 but illustrating bump pad mounting of the laser diode array.

The mounting of the laser diode 30 and submount 32 is better shown in FIGS. 3 and 4.

Turning to FIG. 3, the laser diode array 30 has a number light emitting, lasing semiconductor junctions spaced along an active surface 44. Each lasing junction can be powered to emit a cone 46 of cohering light, only two of which are shown in the drawing. Each lasing junction has a corresponding electrode 48 in the form of a metallic pad deposited on the top side of the diode array. A common electrode on the hidden underside of the diode array 30 is soldered to and in electrical contact with a supply electrode 50 formed by surface metallization of the submount 32. Each of the discrete electrodes 48 is connected by wire bonding 52 to a respective supply electrode pads 54 on the substrate surface 33. Electrical power is supplied by a suitable contact arrangement, not shown in the drawings, to the electrode pads 50, 54 for powering the diode array 30.

FIG. 4 shows an alternate mounting of the laser diode 30 to the substrate 32 by the so called "flip-chip" or bump pad mounting. The diode array 30 is turned over and the discrete electrode pads 48 are directly bonded by soldering to corresponding supply electrodes 54' deposited on the submount surface 33. The common electrode 56, now on the top side of the laser diode 30, is wire bonded at 58 to a corresponding supply electrode 50'. The substrate 32, with the laser diode array 30 premounted on its top surface 33, is then bonded to the upper surface 28 of the common base 12, to make up the integrated optoelectronic coupler 10.

The integrated coupler 10 provides an interface and transition between an electronic circuit where signals are carried by metallic conductors, to an optical transmission line made up of one or more optical fibers. In the integrated coupler 10 of this invention, alignment of the laser diode array 30 is accomplished by first referencing the position of the array 30 to the submount 32, and then referencing the position of the submount to the V-grooved upper substrate 16. Existing manufacturing technology, in particular as implemented by the NGK company mentioned earlier, permits the manufacture of the upper substrate 16 with a high degree of dimensional accuracy.

According to the present invention, the submount 32 is likewise machined to close tolerances. The diode array 30 is mounted to the submount 30 at a known location, normally the center, between two opposite sides of the submount, specifically between side 56 and its opposite side 58. The precise positioning of the laser array 30 in FIG. 3 is accomplished by positioning the array 30 between reference markings 60a and 60b which are accurately placed on the submount 32 by measurement relative to the sides 56, 58. In addition, the active face 44 of the diode array is aligned against the front edge 62 of the submount. This positioning of the diode array 30 on the submount 32 is done on a heated stage of an assembly microscope which melts solder preapplied to the supply electrode 50 and on the common electrode on the underside of the diode array 30. While heated, the solder remains fluid and allows the diode array 30 to be accurately positioned between the reference markings 60a, 60b and against the submount edge 62. Once properly positioned, the solder is allowed to cool, or is actively cooled by a cooling system on the microscope stage, thereby fixing the diode array device to the substrate 32.

FIG. 4 shows an alternate approach for accurately referencing the diode array 30 in relation to the opposite sides 56, 58 of the submount 32. The supply electrode pads 54' are precisely positioned on the submount surface 33 by means of a photolithographic process in relation to the sides 56, 58. The discrete electrode pads 48 of the diode array 30 are dimensioned to match the width of the supply electrodes pads 54'. The submount 32 is placed on a heated assembly stage, with the diode array 30 positioned so that the discrete electrode pads 48 each overlie a corresponding supply electrode pad 54'. Preapplied solder on pads 48, 54' melts under the heating, creating a fluid film between the overlying pads 48, 54'. The molten solder exhibits substantial surface tension which tends to pull the diode array 30 into alignment with the submount pads 54', thereby correctly positioning the diode array 30 with reference to the sides 56, 58. The diode array 30 is also manually aligned against the front edge 62 of the submount 32, as explained in connection with FIG. 3. The use of surface tension of the molten solder to align a semiconductor chip on a substrate provided with contact pads is known in the industry as "bump pad" mounting, and is known technique.

Once the diode array 30 is positioned with reference to the submount 32, the submount 32 is then mounted to the base 12 in alignment with the V-grooved substrate 16 with the aid of parallel guide pins 64 inserted through the pin guides 26. The two guide pins 64 are precisely dimensioned cylindrical pins which make a close sliding fit in the pin guide 26. The rear ends 66 of the guide pins may be fixed in a suitable holder (not shown in the drawings) which support the guide pins in mutually parallel and precisely spaced apart relationship, matching the spacing between the pin guide 26. The guide pins 64 are inserted through the pin guide 26 as shown in FIGS. 6 through 8, and rest upon the upper surface 28 of the base 12.

The submount 32 with the laser diode array 30 premounted to it, is then assembled to the base 12. The submount 32 is placed on the base surface 28 between the guide pins 64. The width of the submount between its opposite surfaces 56, 58 is precisely matched, during its manufacture, to the spacing between the guide pins 64. The submount 32 therefore fits precisely between the two pins 64 on the base surface 28, thereby positioning the laser diodes of the array 30 in optical alignment with the end faces 68 of the optical fibers 40.

It should be appreciated that the integrated optoelectronic coupler 10 avoids the need for active alignment of the laser diode array 30 to the optical fibers 40, by using precise manufacturing and machining methods currently known and practiced in the industry in combination with novel coupler structures and assembly procedures.

The gap spacing between the active, light emitting face 44 of the laser diode array and the end faces 40 of the optical fibers is fixed by the width dimension of the substrate 32 measured between its front edge 62 and rear edge 70, the latter being aligned with the rear side 72 of the base 12.

The preferred material for use in making the submount 32 is the same material used for the V-grooved substrate 16 and the base 12. As previously explained, optical fibers 40 are currently commercially marketed by the aforementioned NGK Company which have an upper substrate 16 machined as needed for use in the present invention, and include a base portion which differs from the base 12 in the drawings only in that it terminates flush with the front surface 22 of the substrate 16. The present invention improves over the sate of the art by providing a common base for supporting the laser array as well as the fiber holder. In particular the substrate 16 and the submount 32 are mounted on a common extended base 12 which has been enlarged to accommodate the submount 32.

The same ceramic materials as presently used in the NGK optical fiber holders and connectors, such as but not limited to alumina, are presently preferred for making the structural components 16, 12 and 32 of the integrated optoelectronic coupler 10 of this invention. These elements are permanently bonded together by means of a suitable adhesive, or by soldering together of metallized surfaces on each of the base, substrate 16 and submount 32. The submount 32 has been described as a separate element from the base 12, but can also be made integrally with the base, eliminating the need for precise positioning of the submount relative to the base. The laser array can then be mounted directly to the integral submount by any of the procedures just described for its mounting to the separate submount.

It will be appreciated that the integrated coupler 10 offers homogeneity of structural materials, thereby avoiding the thermal instabilities inherent in previous optoelectronic couplers and connectors. In addition, the use of ceramic throughout the structure of the coupler 10 assures a high degree of mechanical strength and dimensional stability due to the advantageous mechanical properties of ceramic materials. The result is a compact and rugged optoelectronic coupler which may be expected to perform dependably in commercial applications and which can be manufactured, assembled and aligned economically in commercial quantities. In particular, the need for active alignment of the coupler is eliminated, thereby substantially reducing the cost of manufacture.

Figure 5:
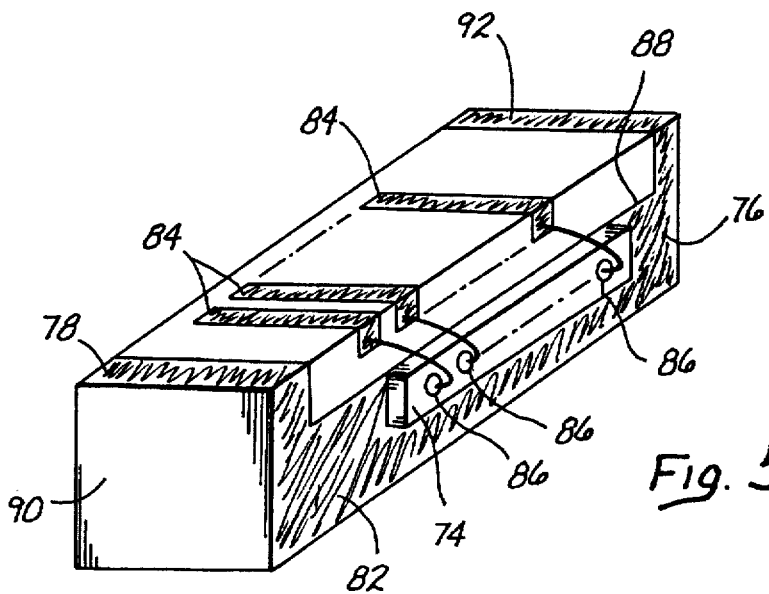
FIG. 5 is a perspective view illustrating the mounting of a photodetector array on a submount for subsequent assembly to an integrated coupler.

The integrated coupler 10 of this invention is equally suitable for use with an optoelectronic receiving package by substituting a photodetector for the laser diode array 30. Turning to FIG. 5, a photodetector array 74 is fixed to a front surface 76 of a photodetector submount 78. The photodetector array 74 is fixed by soldering a common electrode on the hidden underside of the array chip to the metallized surface 82 of the submount 78, which metallized surface also serves as a supply electrode of one polarity. Power of the opposite polarity is supplied by supply electrodes 84 formed on the submount 78 and wire bonded to corresponding individual electrodes 86 for each photodetector element of the array. The alignment of the photodetector array 74 relative to optical fibers 40 on the integrated coupler 10 is obtained in a manner analogous to that described for the laser diode array 30 in FIG. 3. In general, however, the alignment of photodetectors is less difficult and less critical than for laser diode arrays. Consequently, the detector array 74 can be positioned on the submount 78 by reference to preset markings or features on the submount, such as the electrode pads 84, and metallization edge 88. The dimension between opposite sides 90 and 92 is closely matched to the spacing between the guide pins 64 in FIGS. 6 through 8, and submount 78 is assembled to the base 12 of the coupler 10 in the manner previously described in connection with the submount 32 of the laser diode array.

Turning to FIG. 9, an integrated optoelectronic coupler 10' is shown which differs from the coupler 10 of FIGS. 1 through 8 in that an optical scrambler unit 100 has been interposed between the laser diode array 30 and the end faces 68 of the optical fibers held by the V-grooved substrate 16. The scrambler unit is made up of two elements, as shown in FIG. 12, an upper V-grooved substrate 102 and a lower substrate 104 which are joined together as shown in the phantom lined and solid lined depictions of the scrambler unit 100 in FIG. 9. The two substrates 102, 104 define between them a number of passages each having a triangular cross-section which matches the triangular cross-section of the channels containing the optical fibers between the lower substrate 18 and upper substrate 16 of the coupler. Furthermore, the scrambler is manufactured by the same methods and using the same materials as for the V-grooved substrate 16. For example, the upper substrate 102 of the scrambler can be obtained by simply slicing a V-grooved substrate 16, thereby precisely matching the triangular channels of the fiber holder assembly, while the lower substrate 104 can be simply a rectangular block of the same material. The assembled scrambler unit 100 can be aligned with the triangular channels containing the optical fibers by inserting guide segments of optical fiber or rigid pins of the same diameter as the fibers through the triangular channels 106 of the scrambler unit and into the triangular channels of the optical fiber holder, i.e. between the upper substrate 16 and lower substrate 18. In the alternative, the scrambler unit 102 can also be aligned by means of the same guide pins 64, shown in FIGS. 6 through 8, passing through pin guide passages of the scrambler unit analogous to the pin guides 26 of the upper substrate 16 in FIGS. 1 and 2. Again, in such a case, the upper substrate 102 of scrambler unit can be a slice taken from a V-grooved substrate 16, including the pin guide portions of that substrate.

The scrambler unit 100 may be installed in the coupler 10' with the passages 106 simply open to the light emitted by the laser array 30, in which case the scrambling effect occurs by multiple reflections of the laser light from the internal surfaces of the triangular passages 106. Alternatively, each triangular passage 106 may be fitted within optical element such as a rod lenses 108 which is of cylindrical cross-section and fits in the triangular passage 106 in a manner analogous to the optical fibers 40 in the triangular channels 36 . As a result, alignment of the rod lenses 108 with a corresponding optical fiber 40 is assured.

FIG. 11 shows yet another alternative scrambler unit 110 which differs from the previously described scrambler units 100 and 100' in that it is made of a single block 110' of transparent ceramic, in which are integrally formed concave microlenses 114. The scrambler unit block 112 is machined to precise dimensions so that optical alignment of the microlenses 114 with corresponding optical fibers 40 can be obtained by positioning the scrambler 110 on the base surface 28 and then simply aligning, for example, a side 116 of the block 112 with a side 17 of the V-grooved substrate 16. The microlenses 114 can be made in different configurations and are not limited to the concave lens shown in FIG. 11. For example, the microlenses 114 can be convex lenses on a planar surface of the block 112.

By making the scrambler, in any of its three versions 100, 100' and 110, of the same material as the other structural components of the coupler 10', namely, the V-grooved substrate 16, the base 12 and submount 32, a high degree of thermal stability can be achieved. Furthermore, by physically integrating the scrambler into the already integrated coupler 10', a high degree of mechanical strength and stability can also be achieved, for superior performance of the assembly. Furthermore, this superior performance is obtained at lower manufacturing cost than for equivalent units made by previous methods.

The integrated coupler 10' of FIG. 9 is further provided with a pair of notches 120, each of which traverses a side surface of the V-grooved substrate 16 and base 12 and is parallel to the rear surface 24 of the substrate 16. The notches 120 are configured as female detents engageable by corresponding male fingers 122 of a conventional MTB type connector 130, as shown in FIG. 13. The MTB connector 130 includes an MT type connector 132 mounted inside a shell 134. The MT connector 132 has a pair of alignment pins 136, only one of which is shown in FIG. 13, which fit into corresponding holes 144 in the rear face 24' of the coupler 10'. The MT connector holds a number of optical fibers 138 which extend from a fiber ribbon 140. The optical fibers 138 terminate at a connector face 142 which makes close contact with the rear surface 24' of the integrated coupler 10'. The optical fibers 40 held in the coupler 10' terminate in end faces which are flushed with the rear surface 24', and are in optical alignment with corresponding fibers 138 of the connector 130 when the fingers 122 of the connector engage in the grooves 120. This arrangement further integrates the coupler 10' by incorporating a connector function into the body of the coupler, eliminating the need for a separate connector at the end of a pig-tail ribbon 38 as shown in FIG. 7.

FIGS. 14 and 15 illustrate an alternate method for assembling an integrated coupler 10" according to this invention. A V-grooved upper substrate 16' is mounted on a lower substrate 18' to define channels of triangular cross-section for holding optical fibers as described in connection with the coupler 10 of FIGS. 1 and 2. The lower substrate 18' is mounted on a base 12'. A laser diode array 30 is mounted on a submount 32' as has been described in connection with FIGS. 3 and 4. The submount 32' has notches 150a which align with notches 150b in the base 12'. Notches 150a and 150b are best made by a single pass of a coupling blade, to assure their exact alignment. The position of the submount 32' is referenced to the base 12' with the aid of a pair of parallel guide pins 160, mounted to a suitable holder (not shown in the drawings) to assure exact spacing between the pins, are used to assemble the submount 32' to the base 12'. The pins 160 fit closely within the notches 150a and 150b bring the notches into exact registry with each other. The precise dimensioning of the submount then assures that the laser array will be coupled to the optical fibers. The submount is then permanently fixed to the base, preferably by soldering together of metallized contacting surfaces. This method of assembly assures precise positioning of the submount 32' in two dimensions relative to the base 12', i.e. the two dimensions of the upper surface 28' of the base 12. This method is better suited for commercial production, as it requires a lesser degree of skill by the assembly workers than the configuration of coupler 10 in FIGS. 1 and 2. The coupler 10, however, makes use of existing and commercially available V-grooved substrate 16 and thus requires a lesser degree of retooling.

The various structural components of the integrated coupler, in all the embodiments described above, can be permanently assembled by metallizing some or all surfaces of the components and soldering together contacting surfaces. Metallization of the surfaces of the integrated coupler is especially advantageous when the integrated coupler is mounted in a mounting hole formed in the housing of an optoelectronic package. In that case the metallized surfaces when electrically connected to the housing provide shielding against entry of electromagnetic noise and interference through the mounting hole into the package. FIG. 13 shows the integrated coupler 10' mounted in hole 172 of an optoelectronic package housing 170. A gasket 174 provides a hermetic seal between the coupler 10' and the housing 170. An electrical connection between metallized surfaces of the coupler 10' and the housing 170' may also be provided by selecting an electrically conductive gasket material, or by any other convenient means. A fully sealed coupler mounting is made by filling the interior spaces 35 in the triangular channels of the optical fiber holder between the circular cross-section of the optical fiber 40 and the triangular cross-section of the channels, seen in FIG. 8a. This is accomplished by metallizing the interior surfaces of the triangular channel as well as the cylindrical surface of the fibers 40, and flowing molten solder into the void spaces 35.

While certain preferred embodiments of the invention have been described and illustrated for purposes of clarity and example, it must be understood that many changes, substitutions, and modifications to the described embodiments will become obvious to those possessed of ordinary skill in the art without thereby departing from the scope and spirit of the present invention which is defined by the following claims.

What is claimed is:

1. An optoelectronic package comprising:
   an enclosure having a plurality of walls including one wall having a mounting hole;
   an optoelectronic assembly having a plurality of substrate elements affixed to one another, an optical cable having one or more optical fibers terminating in fiber ends clamped between two or more of said substrate elements, and an optoelectronic device supported on one or more of said substrate elements in optically coupled relationship with said fiber ends, said substrate elements being supported on said wall through said hole such that said fiber ends and said optoelectronic device are supported interiorly to said enclosure and said cable extends, to the exterior of said enclosure, and said assembly is joined to said one wall for hermetically sealing said hole.

2. The optoelectronic package of claim 1 further comprising seal means between said substrate elements and said one wall.

3. The optoelectronic package of claim 2 wherein said seal means is of electrically conductive material.

4. The optoelectronic package of claim 1 wherein said fiber ends have a circular cross section and are contained in channels of triangular cross section defined between said two or more of said substrates, said channels communicating an inner side and an outer side of said assembly in said hole, void spaces defined in said channels between said triangular cross-section and said circular cross-section, filler material filling said void spaces for hermetically sealing said channels between said inner side and said outer side.

5. The optoelectronic package of claim 4 wherein said channels have interior wall surfaces and said optical fibers each have an outer fiber surface, said wall surfaces and said outer surface being metallized, said filler material comprising metallic solder.

6. The optoelectronic package of claim 1 wherein said optoelectronic device and said fiber ends are supported to a common one of said substrate elements within said enclosure.

7. The optoelectronic package of claim 1 wherein at least some of said substrates have metallized surfaces and further having electrically conductive seal means between said metallized surfaces and said one wall, whereby said assembly provides both a hermetic closure and electromagnetic shielding in said hole.

8. The optoelectronic package of claim 1 wherein said optical fibers terminate at second fiber ends accessible exteriorly to said enclosure, said substrate elements defining a connector body having coupling means adapted to make retentive mechanical engagement with an optical fiber connector for releasably securing the a said optical fiber connector in optical alignment with said second fiber ends.

9. A hermetically sealed optoelectronic package comprising:
   an optoelectronic package housing having a plurality of walls including one wall and a mounting hole defined in said one wall;
   an optoelectronic assembly mounted in said hole, said assembly having a plurality of substrate elements, one or more optical fibers terminating in fiber ends clamped between two or more of said substrate elements defining a fiber holder, said optical fibers extending to an outer side of said holder relative to said one wall, an optoelectronic device supported to said fiber holder and optically coupled to said fiber ends on an inner side of said one wall, metallized surfaces on at least some of said substrates and electrically conductive seal means between said metallized surfaces and said one wall, whereby said optoelectronic assembly mounted in said hole provides a hermetical seal and electromagnetic shielding to said housing.

10. The optoelectronic package of claim 9 wherein said fiber ends are contained in channels defined between said two or more substrates, voids extending the length of said channels between said fibers and said substrates, and filler material filling said voids to seal said channels.

11. The optoelectronic package of claim 10 wherein said filler material is electrically conductive to provide electromagnetic shielding of said housing.

12. The optoelectronic package of claim 9 wherein said optical fibers terminate in fiber ends flush with an exterior surface of said fiber holder, said assembly further having means for mechanically retaining an optical fiber connector in optical alignment with said optical fibers.

13. The optoelectronic package of claim 9 wherein said plurality of substrates is supported only to said one wall.

14. The optoelectronic package of claim 9 wherein said plurality of substrates are permanently joined to one another.

15. An optoelectronic module comprising a plurality of substrate elements, one or more optical fibers clamped between two or more of said substrate elements, said fibers having first fiber ends and second fiber ends, and an optoelectronic device supported to said substrates in optical coupling with said first fiber ends, said substrate elements defining a connector body having coupling means adapted to make retentive mechanical engagement with an optical fiber connector for releasably securing the optical fiber connector in optical alignment with said second fiber ends.

16. The optoelectronic module of claim 15 in combination with an optoelectronic package housing, said housing having a plurality of housing walls including a mounting hole defined in one of said housing walls, said second fiber ends terminating at a rear end of said connector body, said connector body being mounted in said hole with said optoelectronic device and said first fiber ends contained in said housing and said rear end accessible exteriorly to said housing.

17. The combination of claim 16 further comprising hermetic seal means between said connector body and said housing.

18. An optoelectronic package comprising:
   an enclosure having a plurality of walls including a wall having a mounting hole;

an optoelectronic device in said enclosure;

rigid substrate means extending through said mounting hole, one or more optical conductors supported on said substrate means through said mounting hole, said optical conductors each having an outer end exterior to said enclosure and an interior end supported on said substrate means in optical alignment with said optoelectronic device in said enclosure; and a hermetic seal between said substrate means and said a wall for hermetically sealing said mounting hole.

19. The optoelectronic package of claim 18 wherein said one or more optical conductors comprise one or more optical fibers.

20. The optoelectronic package of claim 19 wherein said one or more optical fibers have a circular cross section and are contained in channels of triangular cross section defined between said two or more substrates, said channels communicating an inner side and an outer side of said substrates, void spaces defined in said channels between said triangular cross-section and said circular cross-section, and filler material filling said void spaces for hermetically sealing said channels between said inner side and said outer side.

21. The optoelectronic package of claim 20 wherein said filler material is electrically conductive thereby to provide electromagnetic shielding of said enclosure.

22. The optoelectronic package of claim 21 wherein said channels have interior wall surfaces and said optical fibers each have an outer fiber surface, said wall surfaces and said outer surface being metallized, said filler material comprising metallic solder.

23. The optoelectronic package of claim 18 wherein said substrate means is rigid between a rear end exterior to said enclosure and a front end interior to said enclosure, and said one or more optical conductors extend on said substrate means continuously between said outer end and said inner end.

24. The optoelectronic package of claim 18 wherein said substrate means comprise two or more substrate elements and said optical conductors are contained between at least two of said substrate elements.

25. The optoelectronic package of claim 18 wherein said substrate means have electrically conductive surfaces and said hermetic seal is also electrically conductive, thereby providing electromagnetic shielding of said enclosure.

26. The optoelectronic package of claim 18 wherein said optoelectronic device is supported on said substrate means such that said optical conductors, said optoelectronic device and said substrate means constitute an integrated optoelectronic receiver or transmitter module.

27. The optoelectronic package of claim 18 wherein said substrate elements define an optical connector body having coupling means exterior to said enclosure and adapted to make retentive mechanical engagement with an optical fiber connector for retaining the a said optical fiber connector in optical alignment with each said outer end of said one or more optical conductors.

28. An optoelectronic package comprising:

an enclosure having a plurality of walls including a wall having a mounting hole;

an optoelectronic device in said enclosure; and one or more optical conductors extending through said mounting hole into said enclosure, said one or more optical conductors each having an outer end exterior to said enclosure and an interior end, rigid substrate means mounted to said a wall hermetically closing said mounting hole, said interior end of each said one or more optical conductors being supported on said substrate means in optical alignment with said optoelectronic device.

29. The optoelectronic package of claim 28 wherein said substrate means extends through said mounting hole and has a rear end exterior to said enclosure and a front end inside said enclosure, said substrate means is rigid between said rear end and said front end, and said one or more optical conductors extend continuously between said outer end and said inner end.

30. The optoelectronic package of claim 28 wherein said one or more optical conductors are rigidly contained by said substrate means between said inner end and said outer end.

31. A method for making an optoelectronic package comprising:

providing an enclosure having a plurality of walls including one wall having a mounting hole;

assembling an optoelectronic module having a plurality of substrate elements affixed to one another, one or more optical fibers terminating in fiber ends clamped between two or more of said substrate elements, and an optoelectronic device supported on one or more of said substrate elements in optically coupled relationship with said fiber ends, optically aligning said optoelectronic device with said fiber ends;

mounting said module in said hole such that said fiber ends and said optoelectronic device are supported interiorly to said enclosure and said optical fibers extend to the exterior of said enclosure.

32. The method of claim 31 further comprising the step of joining said module to said wall for hermetically sealing said hole.

33. The method of claim 31 further comprising the step of electromagnetically shielding the interior of said enclosure by electrically connecting a metallic covering on said module to said wall.

34. A method for making an optoelectronic package comprising the steps of:

providing an enclosure having a plurality of walls including a wall having a mounting hole;

providing an optoelectronic device in said enclosure;

supporting one or more optical conductors including an inner end of each said one or more optical conductors on a rigid substrate means;

mounting said rigid substrate means in said mounting hole with said optical conductors extending through said mounting hole and said inner ends in optically coupled relationship with said optoelectronic device; and making a hermetic seal between said substrate means and said wall for hermetically sealing said mounting hole.

35. The method of claim 34 further comprising the step of providing an optical cable terminated at an optical connector, and mechanically connecting said optical connector said rigid substrate means exteriorly to said optical connector as to optically couple said one or more optical conductors with said optical cable.

36. The method of claim 34 further comprising the step of electromagnetically shielding the interior of said enclosure by electrically connecting a metallic covering on said substrate means to said wall.

37. The method of claim 34 further comprising the step of assembling one or more ceramic substrate elements to make said substrate means.

* * * * *